(12) United States Patent
Yamamoto

(10) Patent No.: US 7,196,738 B2
(45) Date of Patent: Mar. 27, 2007

(54) TUNER INTEGRATED CIRCUIT AND TELEVISION TUNER USING THE SAME CIRCUIT

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 502 days.

(21) Appl. No.: 10/349,340

(22) Filed: Jan. 21, 2003

(65) Prior Publication Data

US 2003/0137608 A1 Jul. 24, 2003

(30) Foreign Application Priority Data

Jan. 22, 2002 (JP) .............................. 2002-012674

(51) Int. Cl.
*H04N 5/50* (2006.01)
(52) U.S. Cl. ...................... 348/731; 348/732; 348/733; 348/725; 455/209; 455/259; 334/1
(58) Field of Classification Search ................ 348/731, 348/732, 733, 725, 730; 455/180.4, 209, 455/258, 259, 260, 265, 315, 319; 334/18, 334/21, 28, 1
See application file for complete search history.

(56) References Cited

U.S. PATENT DOCUMENTS 6,243,567 B1 * 6/2001 Saito ........................ 455/188.2

6,816,203 B2 * 11/2004 White ........................ 348/607
6,847,812 B2 * 1/2005 Doetsch et al. ............. 455/316
6,933,984 B2 * 8/2005 Yamamoto et al. ......... 348/731

FOREIGN PATENT DOCUMENTS

EP 0 899 877 A 3/1999
JP H11-055145 2/1999

OTHER PUBLICATIONS

English language abstract of Japanese patent reference No. 07045962. Patent Abstracts of Japan published by Japanese Patent Office. It is believed that the abstract was published on Feb. 14, 1995.

(Continued)

*Primary Examiner*—David Ometz
*Assistant Examiner*—Jean W. Désir
(74) *Attorney, Agent, or Firm*—Brinks Hofer Gilson & Lione

(57) ABSTRACT

One embodiment of a tuner integrated circuit includes two mixer circuits, an IF amplifier circuit, three oscillation circuits, a PLL circuit, and a reference oscillation circuit. A plurality of terminals are provided at two sides of the tuner integrated circuit and are connected to these elements. Among the terminals, at least an oscillator-connecting terminal for connecting an externally provided oscillator to the reference oscillation circuit, a power supply terminal through which a power supply voltage is supplied, and a ground terminal connected to a ground are provided at one side of the tuner integrated circuit. The power supply terminal and the ground terminal are disposed adjacent to the oscillator-connecting terminal such that they sandwich the oscillator-connecting terminal therebetween.

14 Claims, 3 Drawing Sheets

OTHER PUBLICATIONS

English language abstract of Japanese patent reference No. 11054943. Patent Abstracts of Japan published by Japanese Patent Office. It is believed that the abstract was published on Feb. 26, 1999.

English language abstract of Japanese patent reference No. 10135588. Patent Abstracts of Japan published by Japanese Patent Office. It is believed that the abstract was published on May 22, 1998.

English language abstract of Japanese patent reference No. 2000059251. Patent Abstracts of Japan published by Japanese Patent Office. It is believed that the abstract was published on Feb. 25, 2000.

* cited by examiner

TUNER INTEGRATED CIRCUIT AND TELEVISION TUNER USING THE SAME CIRCUIT

BACKGROUND OF THE INVENTION

1. Field of the Invention

The present invention relates to a tuner integrated circuit and a television tuner using this integrated circuit.

2. Description of the Related Art

The circuit configuration and the relationship between the arrangement of terminals of a known tuner integrated circuit (hereinafter referred to as an "IC") 30 and peripheral circuits are described below with reference to the schematic diagram of FIG. 3. As shown in FIG. 3, the IC 30 has sixteen terminals at each of the two opposing sides. Terminals No. 1 through No. 16 are provided for one side 30a, while terminals No. 17 through No. 32 are provided for the other side 30b. A plurality of peripheral circuits, such as a very high frequency (VHF) mixer circuit 31 and a ultrahigh frequency (UHF) mixer circuit 32, are disposed, as shown in FIG. 3, inside the IC 30. The balanced input terminals of the VHF mixer circuit 31 are connected to terminals No. 31 and No. 32, and the input terminal of the UHF mixer circuit 32 is connected to terminal No. 29. The balanced output terminals of the VHF mixer circuit 31 and the UHF mixer circuit 32 are connected to terminals No. 26 and No. 27.

Local oscillation signals are supplied from a VHF low-band oscillation circuit 33 and a VHF high-band oscillation circuit 34 to the VHF mixer circuit 31. The two resonance-circuit connecting terminals of the VHF low-band oscillation circuit 33 are connected to terminals No. 1 and No. 2, while the two resonance-circuit connecting terminals of the VHF high-band oscillation circuit 34 are connected to terminals No. 4 and No. 5. A local oscillation signal is supplied from a UHF oscillation circuit 35 to the UHF mixer circuit 32. The four resonance-circuit connecting terminals of the UHF oscillation circuit 35 are connected to terminals No. 6 through No. 9.

Channel-selection data is input into terminals No. 17 through No. 19 from a television receiver (not shown). This selection data is input into a phase-locked loop (PLL) circuit 37 and a band-switching-voltage generating circuit 38 via an interface 36. Local oscillation signals are input into the PLL circuit 37 from the oscillation circuits 33, 34, and 35, and also, the tuning voltage for controlling the oscillation frequencies is output to terminal No. 15. A reference signal is input into the PLL circuit 37 from a reference oscillation circuit 39. The oscillator connecting terminal of the reference oscillation circuit 39 is connected to terminal No. 16.

The band-switching-voltage generating circuit 38 generates a high/low-level switching voltage according to the input data. This switching voltage is used for switching the band and is output to terminals No. 23 through No. 25.

An intermediate frequency (IF) amplifier circuit 40 is a balanced type, and the two input terminals are connected to terminals No. 21 and No. 22, while the output terminals thereof are connected to terminals No. 11 and No. 12. Terminals No. 3, No. 10 and No. 28 are grounded, and a power supply voltage is applied to terminal No. 13 so as to be supplied to the individual circuits.

Peripheral circuits are also provided outside the IC 30. A VHF tuning circuit 41 is connected to terminals No. 31 and No. 32, and a UHF tuning circuit 42 is connected to terminal No. 29. The input terminals of an IF tuning circuit 43 are connected to terminals No. 26 and No. 27, while the output terminals thereof are connected to terminals No. 21 and No. 22.

A low-band resonance circuit 44 is connected to terminals No. 1 and No. 2, a high-band resonance circuit 45 is connected to terminals No. 4 and No. 5, and a UHF resonance circuit 46 is connected to terminals No. 6 through No. 9. An oscillation device 47, such as a crystal resonator, is connected to terminal No. 16.

With this configuration, the tuning voltage output from terminal No. 15 and the switching voltages output from terminals No. 23 through No. 25 are applied to the tuning circuits 41 and 42 and the resonance circuits 44, 45, and 46, and these elements are set to receive the channel designated by the input data. Then, a television signal of the selected band is input into the VHP mixer circuit 31 and the UHF mixer circuit 32 from the tuning circuits 41 and 42, and is converted into IF signal components. The IF signal components are output to terminals No. 11 and No. 12 via the IF tuning circuit 43 disposed outside the IC 30 and the IF amplifier circuit 40 disposed inside the IC 30.

According to the IC 30 configured as described above, when the reference oscillation circuit 39 oscillates, a reference oscillation signal appears at terminal No. 16. The reference oscillation signal has a frequency of about 4 MHz, and, in particular, the higher harmonics of this signal are transmitted to the other terminals located in close proximity with terminal No. 16, and superimpose on the signals and the voltages output from such terminals, thereby interfering with the normal reception. For example, the tuning voltage is output to terminal No. 15, which is located adjacent to terminal No. 16, and even a slight change in the tuning voltage disadvantageously modulates the oscillation frequencies of the oscillation circuits 33, 34, and 35.

SUMMARY

Disclosed herein are systems and techniques with a variety of benefits applicable to tuner electronics. One of skill in the art will appreciate that not all of the benefits may be available in every implementation of the systems and techniques. For example, one disclosed embodiment of a tuner IC can substantially prevent a reference oscillation signal appearing at a terminal connected to an oscillator from being transmitted to the other terminals. This disclosure also describes one embodiment of an IC circuit that decreases the interference between peripheral circuits provided for the IC circuit when the IC circuit is mounted on a printed circuit board.

One embodiment of a tuner IC is disclosed with: a mixer circuit for converting an input television signal into an IF signal; an IF amplifier circuit for amplifying the IF signal; an oscillation circuit for supplying a local oscillation signal to the mixer circuit; a PLL circuit for outputting a tuning voltage so as to control the frequency of the local oscillation signal by the tuning voltage; a reference oscillation circuit for supplying a reference oscillation signal to the PLL circuit. The mixer circuit, the IF amplifier circuit, the oscillation circuit, the PLL circuit, and the reference oscillation circuit are disposed within the tuner IC. A plurality of terminals are provided for two opposing sides of the tuner IC and are connected to the mixer circuit, the IF amplifier circuit, the oscillation circuit, the PLL circuit, and the reference oscillation circuit. Among the plurality of terminals, at least an oscillator connecting terminal for connecting an externally provided oscillator to the reference oscillation circuit, a power supply terminal through which a power supply voltage is supplied, and a ground terminal connected to a ground are provided at one of the two opposing sides of the tuner IC, and the power supply terminal and the ground terminal are disposed adjacent to the oscillator connecting terminal such that they sandwich the oscillator connecting terminal therebetween.

With this configuration, when the reference oscillation circuit oscillates, a reference oscillation signal appears at the oscillator connecting terminal. However this terminal is sandwiched between the ground terminal and the power supply terminal, which serve the shielding function, thereby preventing the reference oscillation signal from being transmitted to the other terminals disposed across the oscillator connecting terminal. A DC pin is a pin operable to carry a current at a constant voltage.

Also disclosed is a television tuner including the above-described tuner IC and a printed circuit board on which the tuner IC is mounted. On the printed circuit board are disposed connecting leads that can be soldered to the plurality of terminals of the tuner IC. Also disposed on the printed circuit board are wiring conductors, which includes first, second, third, and fourth wiring conductors, and which are connected to the connecting leads. A first circuit connected to the connecting leads is formed to provide for the terminals that are disposed farther away from the oscillator connecting terminal than the ground terminal. A second circuit connected to the connecting leads is formed to provide for the terminals that are disposed farther away from the oscillator connecting terminal than the power supply terminal. The first wiring conductor, which is connected to the connecting lead provided for the ground terminal, is extended between an area in which the first circuit is formed and an area in which the second circuit is formed.

In an area of the printed circuit board in which the tuner IC is mounted, the second wiring conductor, which opposes the connecting leads connected to the first circuit and which is connected to the connecting lead provided for the ground terminal, and the third wiring conductor, which opposes the connecting leads connected to the second circuit and which is connected to the connecting lead provided for the power supply terminal, may be provided. In the area in which the tuner IC is mounted, the fourth wiring conductor, which opposes the second wiring conductor and the third wiring conductor and which is connected to the connecting lead provided for the oscillator connecting terminal, may be provided farther inwards than the second wiring conductor and the third wiring conductor.

With this version of the arrangement, since the second wiring conductor and the third wiring conductor serve the shielding function, the reference oscillation signal appearing at the fourth wiring conductor can be prevented from leaking to the first circuit and the second circuit.

DESCRIPTION OF THE PREFERRED EMBODIMENTS

The circuit configuration and the relationship between the arrangement of terminals of a tuner IC 10 and the peripheral circuits are described below with reference to the schematic diagram of FIG. 1. The configuration of a television tuner using the IC 10 is shown in FIG. 2.

Figure 1:
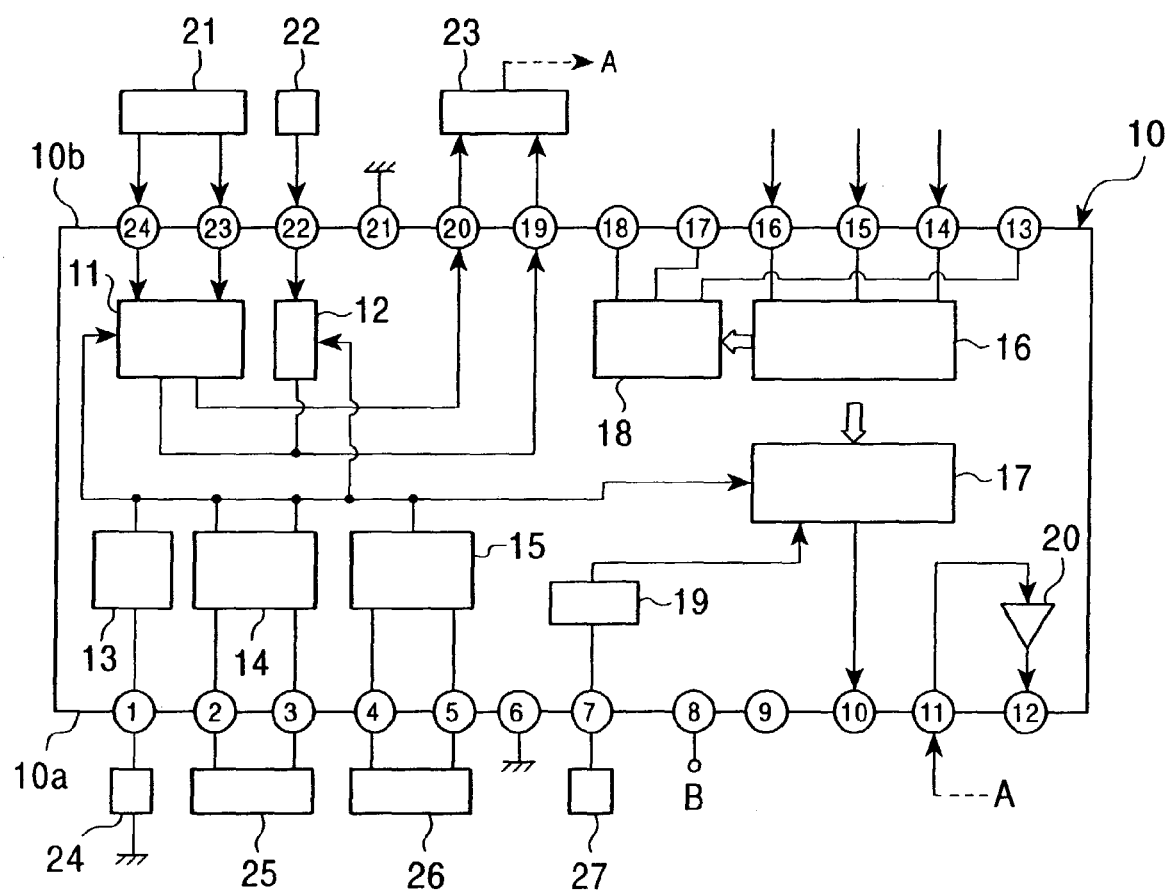
FIG. 1 is a circuit diagram illustrating the configuration of a tuner IC.
Figure 2:
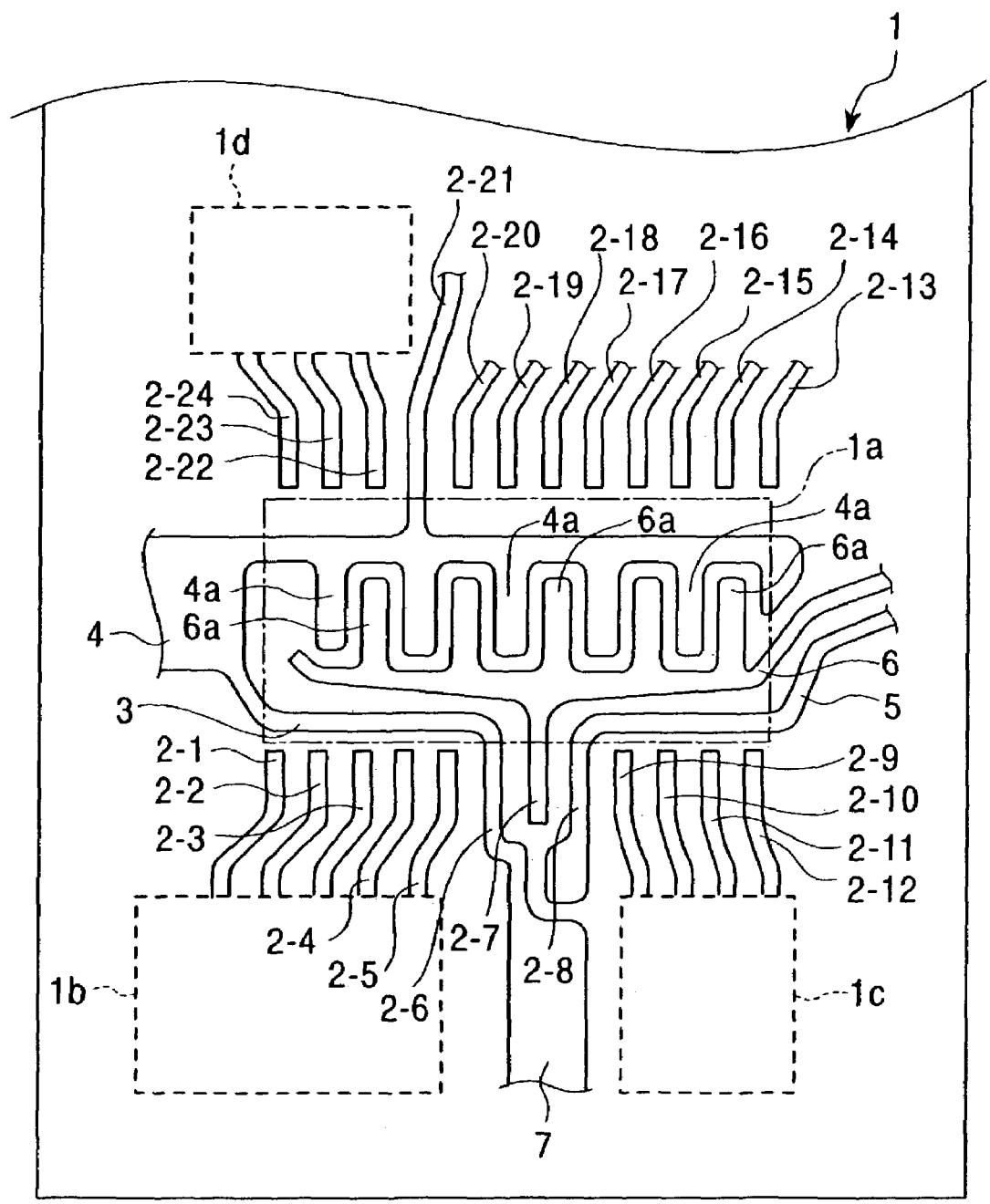
FIG. 2 illustrates a circuit layout of a printed circuit board suitable for mounting in a television tuner.
Figure 3:
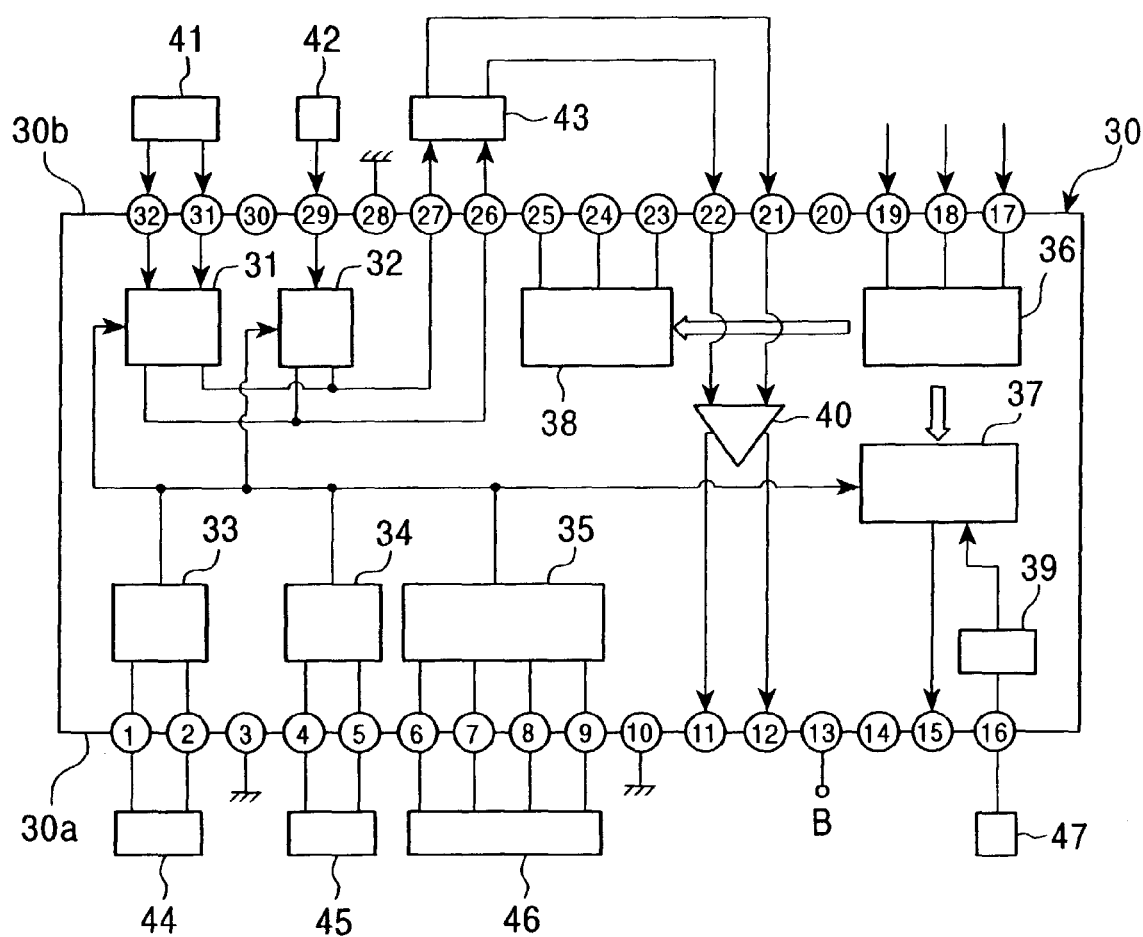
FIG. 3 is a circuit diagram illustrating the configuration of a known tuner IC.

As shown in FIG. 1, the IC 10 has twelve terminals at each of two opposing sides. Terminals No. 1 through No. 12 are provided for one side 10a, while terminals No. 13 through No. 24 are provided for the other side 10b. A plurality of peripheral circuits, such as a VHF mixer circuit 11 and a UHF mixer circuit 12, are disposed inside the IC 10. The balanced input terminals of the VHF mixer circuit 11 are connected to terminals No. 23 and 24, and the input terminal of the UHF mixer circuit 12 is connected to terminal No. 22. The balanced output terminals of the VHF mixer circuit 11 and the UHF mixer circuit 12 are connected to terminals No. 19 and No. 20.

Local oscillation signals are supplied from a VHF low-band oscillation circuit 13 and a VHF high-band oscillation circuit 14 to the VHF mixer circuit 11. The resonance-circuit connecting terminal of the VHF low-band oscillation circuit 13 is connected to terminal No. 1, while the two resonance-circuit connecting terminals of the VHF high-band oscillation circuit 14 are connected to terminals No. 2 and No. 3. A local oscillation signal is supplied from a UHF oscillation circuit 15 to the UHF mixer circuit 12. The two resonance-circuit connecting terminals of the UHF oscillation circuit 15 are connected to terminals No. 4 and No. 5.

Channel-selection data is input into terminals No. 14 through No. 16 from a television receiver (not shown). This selection data is input into a PLL circuit 17 and a band-switching-voltage generating circuit 18 via an interface 16. Local oscillation signals are input into the PLL circuit 17 from the oscillation circuits 13, 14, and 15, and also, the tuning voltage for controlling the oscillation frequencies is output to terminal No. 10. A reference signal is input into the PLL circuit 17 from a reference oscillation circuit 19. The oscillator connecting terminal of the reference oscillation circuit 19 is connected to terminal No. 7.

The band-switching-voltage generating circuit 18 generates a high/low-level switching voltage according to the input data. This switching voltage is used for switching the band and is output to terminals No. 13, No. 17, and No. 18.

The input terminal of an IF amplifier circuit 20 is connected to terminal No. 11, and the output terminal thereof is connected to terminal No. 12. Terminals No. 6 and No. 21 are grounded, and terminal No. 8 serves as a power supply terminal through which a power supply voltage is supplied to the individual circuits.

Peripheral circuits are also provided outside the IC 10. A VHF tuning circuit 21 is connected to terminals No. 23 and No. 24, and a UHF tuning circuit 42 is connected to terminal No. 22. The input terminals of an IF tuning circuit 23 are connected to terminals No. 19 and No. 20, while the output terminal thereof is connected to terminal No. 11.

A low-band resonance circuit 24 is connected to terminal No. 1, a high-band resonance circuit 25 is connected to terminals No. 2 and No. 3, and a UHF resonance circuit 26 is connected to terminals No. 4 and No. 5. An oscillator device 27, such as a crystal resonator, is connected to terminal No. 7.

With this configuration, the tuning voltage output from terminal No. 10 and the switching voltages output from terminals No. 17 and No. 18 are applied to the tuning circuits 21 and 22 and the resonance circuits 24, 25, and 26, and such elements are set to receive the channel designated by the input data. Then, a television signal of the selected band is input into the VHF mixer circuit 11 and the UHF mixer circuit 12 from the tuning circuits 21 and 22, respectively, and is converted into IF signal components. The IF signal components are output to terminal No. 12 via the IF tuning circuit 23 disposed outside the IC 10 and the IF amplifier circuit 20 disposed inside the IC 10.

In the above-described IC 10, when the reference oscillation circuit 19 oscillates, a reference oscillation signal appears at terminal No. 7, which is an oscillator connecting terminal. Terminal No. 7 is sandwiched between terminal 6, which is a ground terminal, and terminal No. 8, which is a power supply terminal. Accordingly, terminals No. 6 and No. 8 serve the function of shielding terminal 7, and thus, the reference oscillation signal is not transmitted to the other terminals, such as No. 1 through No. 5 and No. 9 through No. 12.

FIG. 2 partially illustrates the layout of a television tuner formed by mounting the above-described IC 10 on a printed circuit board 1.

The IC 10 is mounted on a first area 1a on the printed circuit board 1. Twelve connecting leads 2-1 through 2-12 are provided at one side of the first area 1a, and are soldered to terminals No. 1 through No. 12, respectively, of the IC 10. Twelve connecting leads 2-13 through 2-24 are provided at the other side of the first area 1a, and are soldered to terminals No. 13 through No. 24 of the IC 10. Among these connecting leads, the connecting leads 2-1 through 2-5 are extended to a second area 1b. In the second area 1b, a first circuit including the low-band resonance circuit 24, the high-band resonance circuit 25, and the UHF resonance circuit 26 shown in FIG. 1 is formed. The connecting leads 2-1 through 2-5 are connected to the low-band resonance circuit 24, the high-band resonance circuit 25, and the UHF resonance circuit 26.

The connecting lead 2-6 is connected to terminal No. 6, which is a ground terminal shown in FIG. 1, and is connected to a ground conductor 4 with a wiring conductor 3 therebetween, the wiring conductor 3 being disposed in the first area 1a while opposing the connecting leads 2-1 through 2-5.

The connecting lead 2-8 is connected to terminal No. 8, which is a power supply terminal shown in FIG. 1, and is connected to a wiring conductor 5, which is disposed in the first area 1a and extends in the direction opposite to the wiring conductor 3 while opposing the connecting leads 2-9 through 2-12. A power supply voltage is supplied to the connecting lead 2-8 via the wiring conductor 5.

A second circuit is formed in a third area 1c, which is disposed near the connecting leads 2-9 through 2-12. The second circuit includes an IF circuit (not shown) connected to terminals No. 11 and No. 12 shown in FIG. 1.

Terminal No. 7, which is an oscillator connecting terminal shown in FIG. 1 is connected to the connecting lead 2-7. In the first area 1a, a wiring conductor 6 is disposed along the wiring conductors 3 and 5 and further inwards than the wiring conductors 3 and 5. The wiring conductor 6 is connected to the connecting lead 2-7, and is also connected to the oscillator device 27 shown in FIG. 1. With this arrangement, the wiring conductor 6 is separated from the connecting leads 2-1 through 2-5 by the provision of the wiring conductor 3, and is separated from the connecting leads 2-9 through 2-12 by the provision of the wiring conductor 5. A plurality of comb-like electrodes 6a connected to the wiring conductor 6 are provided in the first area 1a, and project in the direction opposite to the wiring conductors 3 and 5.

A wiring conductor 7 connected to the connecting lead 2-6 is disposed between the second area 1b and the third area 1c.

As a result, since the wiring conductors 3 and 5 serve the shielding function, the reference oscillation signal appearing at the wiring conductor 6 can be prevented from leaking to the first circuit formed in the second area 1b and the second circuit formed in the third area 1c. The wiring conductor 7 also serves the shielding function, thereby preventing the interference between the first circuit and the second circuit.

A ground conductor 4 is extended in the first area 1a while opposing the connecting leads 2-13 through 2-24, and a plurality of comb-like electrodes 4a connected to the ground conductor 4 are provided. The comb-like electrodes 4a oppose the comb-like electrodes 6a provided for the wiring conductor 6. Accordingly, a stray capacitance is generated between the wiring conductor 6 and the ground conductor 4 with the comb-like electrodes 6a and 4a, respectively, therebetween. This stray capacitance can be designed to suppress the leakage of the higher harmonics of the reference oscillation signal from the wiring conductor 6 to the first circuit and the second circuit.

The connecting leads 2-22 through 2-24 are extended to a fourth area 1d, which is located adjacent to the connecting leads 2-22 through 2-24. In the fourth area 1d, a third circuit including the VHF tuning circuit 21 and the UHF tuning circuit 22 shown in FIG. 1 is formed, and the connecting leads 2-22 through 2-24 are connected to the tuning circuits 21 and 22.

As the term is used herein, one component is "coupled with" another component if the two components are in electrical communication, whether directly or through one or more intermediate components.

What is claimed is:

1. A tuner integrated circuit comprising:
   a mixer circuit for converting an input television signal into an intermediate frequency signal;
   an intermediate frequency amplifier circuit coupled with the mixer circuit and configured for amplifying the intermediate frequency signal;
   an oscillation circuit coupled with the mixer circuit and configured for supplying a local oscillation signal to said mixer circuit;
   a phase-locked loop circuit coupled with the oscillation circuit and configured for outputting a tuning voltage so as to control a frequency of the local oscillation signal by the tuning voltage;
   a reference oscillation circuit coupled with the phase-locked loop circuit and configured for supplying a reference oscillation signal to said phase-locked loop circuit; and
   a plurality of terminals provided for two opposing sides of said tuner integrated circuit and connected to said mixer circuit, said intermediate frequency amplifier circuit, said oscillation circuit, said phase-locked loop circuit, and said reference oscillation circuit,
   wherein, said mixer circuit, said intermediate frequency amplifier circuit, said oscillation circuit, said phase-locked loop circuit, and said reference oscillation circuit are disposed within said tuner integrated circuit, and,
   wherein said plurality of terminals, includes at least:
   an oscillator connecting terminal for connecting an externally provided oscillator to said reference oscillation circuit,
   a power supply terminal through which a power supply voltage is supplied, and
   a ground terminal connected to a ground;
   wherein the power supply terminal and the ground terminal are disposed adjacent to the oscillator connecting terminal such that the oscillator connecting terminal is sandwiched between the power supply terminal and the ground terminal.

2. A television tuner comprising:
said tuner integrated circuit set forth in claim 1;
a printed circuit board on which said tuner integrated circuit is mounted;
connecting leads disposed on said printed circuit board and configured to be soldered to the plurality of terminals of said tuner integrated circuit; and
wiring conductors, which comprise first, second, third, and fourth wiring conductors, connected to the connecting leads, and disposed on said printed circuit board;
a first circuit formed on the printed circuit board and connected to the connecting leads provided for terminals that are disposed farther away from the oscillator connecting terminal than the ground terminal; and
a second circuit formed on the printed circuit board and connected to the connecting leads provided for terminals that are disposed farther away from the oscillator connecting terminal than the power supply terminal;
wherein the first wiring conductor is connected to the connecting lead configured to be soldered to the ground terminal; and
wherein the first wiring conductor is extended between an area in which the first circuit is formed and an area in which the second circuit is formed.

3. A television tuner according to claim 2, wherein:
the second wiring conductor is provided in an area of said printed circuit board in which said tuner integrated circuit is mounted;
the second wiring conductor opposes the connecting leads connected to the first circuit and is connected to the connecting lead provided for the ground terminal;
the third wiring conductor is provided in the area of said printed circuit board in which said tuner integrated circuit is mounted;
the third wiring conductor opposes the connecting leads connected to the second circuit and is connected to the connecting lead provided for the power supply terminal; and,
the fourth wiring conductor is provided in the area of said printed circuit board in which said tuner integrated circuit is mounted;
the fourth wiring conductor opposes the second wiring conductor and
the third wiring conductor and is connected to the connecting lead provided for the oscillator connecting terminal, and
the fourth wiring conductor is provided farther inwards from an edge of said printed circuit board than the second wiring conductor and the third wiring conductor.

4. A tuner circuit comprising:
a reference oscillator configured to generate a reference oscillating signal at a reference frequency;
a reference connector pin disposed on an edge of the tuner circuit electrically coupled to the reference oscillator;
a local oscillator configured to generate a local oscillation signal;
a first local oscillator pin electrically coupled to the local oscillator; and
a DC pin disposed on the edge of the tuner circuit,
wherein the DC pin is disposed between the reference connector pin and the first local oscillator pin, wherein the DC pin is the only DC pin disposed between the reference connector pin and the first local oscillator pin.

5. The tuner circuit of claim 4,
wherein the local oscillator is a VHF low band oscillator and the local oscillation signal is a VHF oscillation signal at a VHF carrier frequency.

6. The tuner circuit of claim 5, further comprising:
a UHF band oscillator configured to generate a UHF oscillation signal at a UHF carrier frequency;
a second local oscillator pin electrically coupled to the UHF band oscillator;
wherein the DC pin is disposed between (a) the reference connector pin and (b) the first and second local oscillator pins.

7. The tuner circuit of claim 4,
wherein the DC pin is a ground pin configured to electrically provide a ground reference to the tuner circuit.

8. The tuner circuit according to claim 4, wherein the first local oscillator pin is disposed at an outer side of the edge of the tuner circuit.

9. A tuner circuit comprising:
a reference oscillator configured to generate a reference oscillating signal at a reference frequency;
a reference connector pin disposed on an edge of the tuner circuit electrically coupled to the reference oscillator;
a PLL circuit configured to generate a tuning signal;
a tuning signal pin electrically coupled to the PLL circuit; and
a DC pin disposed on the edge of the tuner circuit,
wherein the DC pin is disposed between the reference connector pin and the tuning signal pin, wherein the DC pin is the only DC pin disposed between the reference connector pin and the tuning signal pin.

10. The tuner circuit of claim 9,
wherein the DC pin is a power pin configured to connect a DC power supply to the tuner circuit.

11. The tuner circuit of claim 9, further comprising:
a local oscillator configured to generate a local oscillation signal; and
a first local oscillator pin electrically coupled to the local oscillator;
a second DC pin disposed between the reference connector pin and the first local oscillator pin, wherein the second DC pin is operable to carry a second current at a second constant voltage.

12. A tuner circuit comprising:
a first DC pin disposed on an edge of the tuner circuit and operable to carry a first current at a first constant voltage;
a second DC pin disposed on an edge of the tuner circuit and operable to carry a second current at a second constant voltage;
a reference oscillator configured to generate a reference oscillating signal at a reference frequency;
a reference connector pin disposed on an edge of the tuner circuit, disposed immediately between the first and second DC pins, and coupled to the reference oscillator.

13. A television comprising:
an input configured to receive a television signal;
a tuner circuit configured to convert the television signal to an intermediate-frequency signal, the tuner circuit comprising:
a reference oscillator configured to generate a reference oscillating signal at a reference frequency;
a reference connector pin disposed on an edge of the tuner circuit electrically coupled to the reference oscillator;

a local oscillator configured to generate a local oscillation signal;
a first local oscillator pin electrically coupled to the local oscillator; and
a DC pin disposed on the edge of the edge of the tuner circuit,
wherein the DC pin is disposed between the reference connector pin and the first local oscillator pin, and
wherein the DC pin is the only DC pin disposed between the reference connector pin and the first local oscillator pin.

14. A tuner circuit comprising:
a reference oscillator configured to generate a reference oscillating signal at a reference frequency;
a reference connector pin disposed on an edge of the tuner circuit electrically coupled to the reference oscillator;
at least one local oscillator configured to generate a local oscillation signal;
a first local oscillator pin electrically coupled to the local oscillator; and
at least one DC pin disposed on an edge of the tuner circuit,
wherein the at least one DC pin shields the reference oscillating signal from interference with any oscillating signal that is generated on the edge of the tuner circuit.

* * * * *

UNITED STATES PATENT AND TRADEMARK OFFICE
CERTIFICATE OF CORRECTION

PATENT NO. : 7,196,738 B2  
APPLICATION NO. : 10/349340  
DATED : March 27, 2007  
INVENTOR(S) : Masaki Yamamoto It is certified that error appears in the above-identified patent and that said Letters Patent is hereby corrected as shown below:

In the Claims

Column 7, in claim 3, line 47, delete "conductor and".

Column 7, in claim 3, line 48, before "the third wiring conductor" insert --conductor and--.

Signed and Sealed this

Twenty-fourth Day of July, 2007

JON W. DUDAS  
*Director of the United States Patent and Trademark Office*